United States Patent
Park et al.

(10) Patent No.: US 8,941,231 B2
(45) Date of Patent: Jan. 27, 2015

(54) ELECTRONIC CHIP AND METHOD OF FABRICATING THE SAME

(71) Applicant: Electronics and Telecommunications Research Institute, Daejeon (KR)

(72) Inventors: Young Rak Park, Daejeon (KR); Sang Choon Ko, Daejeon (KR); Byoung-Gue Min, Daejeon (KR); Jong-Won Lim, Daejeon (KR); Hokyun Ahn, Daejeon (KR); Sung-Bum Bae, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/938,324

(22) Filed: Jul. 10, 2013

(65) Prior Publication Data

US 2014/0167070 A1    Jun. 19, 2014

(30) Foreign Application Priority Data

Dec. 17, 2012    (KR) .................. 10-2012-0147251

(51) Int. Cl.
| | |
|---|---|
| *H01L 23/12* | (2006.01) |
| *H01L 29/66* | (2006.01) |
| *H01L 23/522* | (2006.01) |
| *H01L 23/532* | (2006.01) |
| *H01L 23/66* | (2006.01) |

(52) U.S. Cl.
CPC ....... *H01L 29/66477* (2013.01); *H01L 23/5225* (2013.01); *H01L 23/5329* (2013.01); *H01L 23/66* (2013.01); *H01L 23/5228* (2013.01); *H01L 2924/0002* (2013.01)
USPC .................................. 257/701; 257/E23.169

(58) Field of Classification Search
USPC .................. 257/296, 379, E27.009, 700, 701, 257/E23.168, E23.169; 438/210, 238
See application file for complete search history.

(56) References Cited

U.S. PATENT DOCUMENTS

| | | | |
|---|---|---|---|
| 4,348,253 A | 9/1982 | Subbarao et al. | |
| 5,041,884 A | 8/1991 | Kumamoto et al. | |
| 6,667,196 B2 | 12/2003 | Yu et al. | |
| 7,893,472 B2 * | 2/2011 | Sashida et al. | 257/295 |
| 8,288,807 B2 * | 10/2012 | Kimura | 257/290 |
| 2012/0182790 A1 * | 7/2012 | Yamazaki et al. | 365/149 |

* cited by examiner

*Primary Examiner* — Quoc Hoang
(74) *Attorney, Agent, or Firm* — Rabin & Berdo, P.C.

(57) ABSTRACT

Provided are an electronic chip and a method of fabricating the same. The semiconductor chip may include a substrate, an active device integrated on the substrate, a lower interlayered insulating layer covering the resulting structure provided with the active device, a passive device provided on the lower interlayered insulating layer, an upper interlayered insulating layer covering the resulting structure provided with the passive device, and a ground electrode provided on the upper interlayered insulating layer. The upper interlayered insulating layer may be formed of a material, whose dielectric constant may be higher than that of the lower interlayered insulating layer.

18 Claims, 7 Drawing Sheets

Fig. 4

| Dielectric | Dielectric constant | Band GaP(eV) |
|---|---|---|
| SiO$_2$ | 3.9 | 9 |
| Si$_3$N$_4$ | 7 | 5.3 |
| Al$_2$O$_3$ | 9 | 8.8 |
| Ta$_2$O$_5$ | 22 | 4.4 |
| TiO$_2$ | 80 | 3.5 |
| SrTiO$_3$ | 2000 | 3.2 |
| ZrO$_2$ | 25 | 5.8 |
| HfO$_2$ | 25 | 5.8 |
| HfSiO$_4$ | 11 | 6.5 |
| La$_2$O$_3$ | 30 | 6 |
| Y$_2$O$_3$ | 15 | 6 |
| a-LaAlO$_3$ | 30 | 5.6 |

ELECTRONIC CHIP AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0147251, filed on Dec. 17, 2012, in the Korean Intellectual Property Office, the entire contents of which are hereby incorporated by reference.

BACKGROUND OF THE INVENTION

Example embodiments of the inventive concept relate to a micro-electronic device, and in particular, to an electronic chip and a method of fabricating the same.

A stable supply of ground voltage is an important consideration in designing most of electronic circuits (especially, RF circuit). For GaAs and Si wafers, a back-side via hole process can be easily performed, and thus, the ground voltage can be supplied to circuits, which may be integrated on the GaAs or Si wafer, through a back side via. However, there is a technical difficulty in performing the back-side via hole process to a wafer made of a rigid material (e.g., SiC). In addition, the back-side via hole process may cause a stress that is applied to a top surface of the wafer and deteriorates characteristics of devices.

A fast thermal emission is required for a power amplifier or a power semiconductor. However, if a wafer is formed of a material having high thermal resistance, there is a difficulty in realizing the fast thermal emission property. Furthermore, the wafer is formed to a thickness of about 100 µm to avoid technical problems in a back-grinding process and a wafer handling, but such a large thickness makes it difficult to achieve the fast thermal emission property. Meanwhile, in electronic circuits (especially, RF circuit), an area of active devices is about 10% of a total chip area and is much smaller than that of passive devices.

SUMMARY

Example embodiments of the inventive concept provide a method of fabricating a semiconductor chip, which is configured to increase a ratio of an area of active devices to a total chip area.

Other example embodiments of the inventive concept provide a method of fabricating a semiconductor chip that is configured to reduce a size of a passive device.

Still other example embodiments of the inventive concept provide a semiconductor chip fabricating method capable of overcoming technical difficulties in a back-side via process.

Even other example embodiments of the inventive concept provide a semiconductor chip, which is configured to increase a ratio of an area of active devices to a total chip area.

Yet other example embodiments of the inventive concept provide a semiconductor chip that is configured to reduce a size of a passive device.

According to example embodiments of the inventive concepts, a semiconductor chip may include a substrate, an active device integrated on the substrate, a lower interlayered insulating layer covering the resulting structure provided with the active device, a passive device provided on the lower interlayered insulating layer, an upper interlayered insulating layer covering the resulting structure provided with the passive device, and a ground electrode provided on the upper interlayered insulating layer. The upper interlayered insulating layer may be formed of a material, whose dielectric constant may be higher than that of the lower interlayered insulating layer.

In example embodiments, the upper interlayered insulating layer may be thinner than the lower interlayered insulating layer.

In example embodiments, the substrate may include at least one of Si, GaAs, InP, SiGe, SiC, or GaN.

In example embodiments, the passive device may be used as one of constituent parts of a high frequency circuit.

In example embodiments, the passive device may be provided below the ground electrode to constitute a micro strip.

In example embodiments, the semiconductor chip may further include an interconnection structure provided on the upper interlayered insulating layer, and plugs formed through the upper and lower interlayered insulating layers to connect the interconnection structure to the passive device and the active device.

In example embodiments, the semiconductor chip may further include plugs connected to the active device. The plugs may be provided on a top side of the substrate, and the substrate has a plate structure that is not penetrated by holes.

In example embodiments, the substrate may be provided to have a thickness that may be smaller than a total thickness of the lower and upper interlayered insulating layers.

In example embodiments, the upper interlayered insulating layer may include at least one of silicon nitride, aluminum oxide, tantalum oxide, titanium oxide, strontium titanate, zirconium oxide, hafnium oxide, hafnium silicate, lanthanum oxide, yttrium oxide, or amorphous lanthanum aluminate.

According to example embodiments of the inventive concepts, a method of fabricating a semiconductor chip may include integrating an active device on a substrate, forming a lower interlayered insulating layer on the substrate integrated with the active device, forming a passive device on the lower interlayered insulating layer, forming an upper interlayered insulating layer to cover wholly the lower interlayered insulating layer provided with the passive device, and forming a metal layer on the upper interlayered insulating layer.

In example embodiments, the substrate may be formed of silicon carbide, and the integrating of the active device may include forming a buffer layer and a channel layer on the substrate using an epitaxial technique, and forming a source electrode, a gate electrode, and a drain electrode on the channel layer.

In example embodiments, the forming of the passive device may include forming a high frequency circuit with a metal pattern.

In example embodiments, the metal pattern may be formed to constitute a micro strip.

In example embodiments, the upper interlayered insulating layer may include forming a dielectric layer, whose dielectric constant may be greater than that of the lower interlayered insulating layer. For example, the upper interlayered insulating layer may include at least one of silicon nitride, aluminum oxide, tantalum oxide, titanium oxide, strontium titanate, zirconium oxide, hafnium oxide, hafnium silicate, lanthanum oxide, yttrium oxide, or amorphous lanthanum aluminate.

In example embodiments, the upper interlayered insulating layer may be formed to have a thickness that is smaller than that of the lower interlayered insulating layer.

In example embodiments, the method may further include forming contact plugs connected to the active device through the lower interlayered insulating layer, before the forming of the passive device, and forming vias connected to the passive device and the contact plugs through the upper interlayered insulating layer, before the forming of the metal layer.

In example embodiments, the method may further include a thinning process reducing a thickness of the substrate. The thinning process may be performed in such a way that a final thickness of the substrate is smaller than a total thickness of the lower and upper interlayered insulating layers.

In example embodiments, after the thinning process, the method may further include forming a lower metal layer to cover the thinned bottom surface of the substrate.

In example embodiments, the step of integrating the active device and its subsequent steps may be independently executed using fabrication facilities that are different from each other and are provided in different buildings.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 4 is a table showing dielectric constants and band gaps of some dielectric materials.

Figure 1:
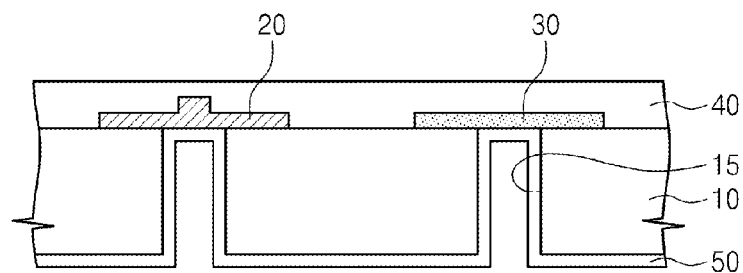
FIG. 1 is a sectional view schematically illustrating a semiconductor chip according to a comparative example.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

For the sake of simplicity and better understanding of example embodiments of the inventive concept, the description that follows will refer to an electronic chip including a compound semiconductor transistor, in which a channel layer of gallium nitride is grown on a substrate of silicon carbide. But example embodiments of the inventive concepts may not be limited to the electronic chip to be described below. For example, Si, GaAs, InP, SiGe, SiC, or GaN may be used as a material for the substrate, according to example embodiments of the inventive concept.

FIG. 1 is a sectional view schematically illustrating a semiconductor chip according to a comparative example.

Referring to FIG. 1, an active device 20 and a passive device 30 may be provided on a substrate 10. A protection insulating layer 40 may be formed on the substrate 10 to cover the active and passive devices 20 and 30. The active and passive devices 20 and 30 may be electrically connected or coupled to a ground line 50 through a via hole 15 formed to penetrate the substrate 10. For example, the ground line 50 may be formed to have a portion covering or filling the via hole 15.

In example embodiments, the substrate 10 may be formed of silicon carbide. In a mechanical property, silicon carbide has a high hardness of about 28 GPa and a high strength of about 500 MPa. In a chemical property, silicon carbide is not reacted with most of acid and basic materials, thereby having a high etch-resistant property. This means that it is hard to form the via hole 15 in the substrate 10 of silicon carbide.

Figure 2:
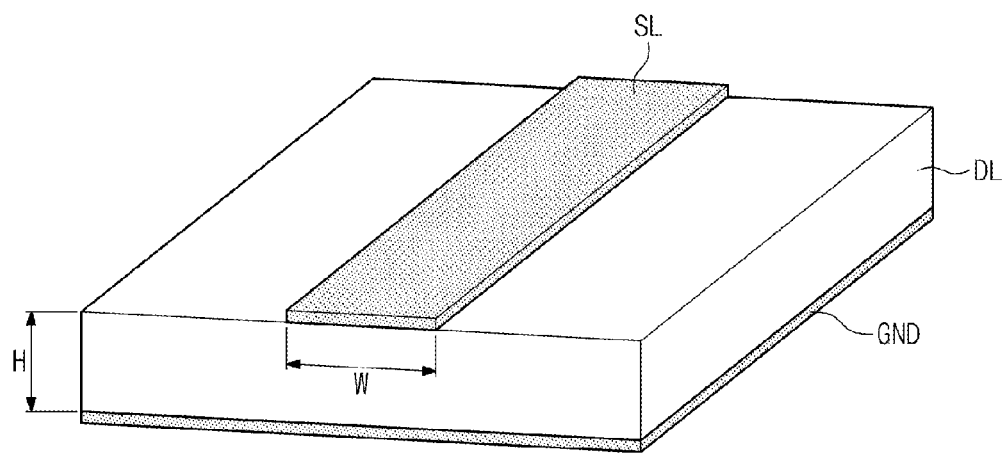
FIG. 2 is a perspective view exemplarily illustrating a passive device (for example, micro strip), which is one of constituent parts of a high frequency circuit.

The semiconductor chip may be configured to include high-frequency circuit. For example, the high frequency circuit may include a micro strip, as shown in FIG. 2. The micro strip may include a signal line SL provided on a planar ground line GND. Due to this simple structure, the micro strip can be formed to have a small size, a light weight, and a structure suitable for mass production and integration. Furthermore, the use of the micro strip makes it possible to realize an array antenna with ease.

A distance between the ground line GND and the signal line SL (i.e., a thickness H of a dielectric layer DL interposed therebetween) and a dielectric constant of the dielectric layer DL may be key parameters, which should be carefully considered in designing of the micro strip.

In the comparative example, the ground line GND may be provided on a bottom surface of the substrate 10, and the signal line SL may be provided on a top surface of the substrate 10. Accordingly, the substrate 10 may serve as the dielectric layer DL of the micro strip. However, to obtain a thickness and a dielectric constant required for the passive device such as micro strip, there is no need to use the substrate 10 as the dielectric layer. Instead, for a hard-processing material such as silicon carbide, it is difficult to control a thickness of dielectric layer, which is one of key parameters in designing a micro strip. For all that, there is a difficulty to provide the substrate 10 made of a material, which is suitable for the passive device, such as the micro strip, in that the substrate 10 is a substance for realizing the active devices. In other words, it is also difficult to change a dielectric constant, which is another of key parameters in designing a micro strip.

Figure 3:
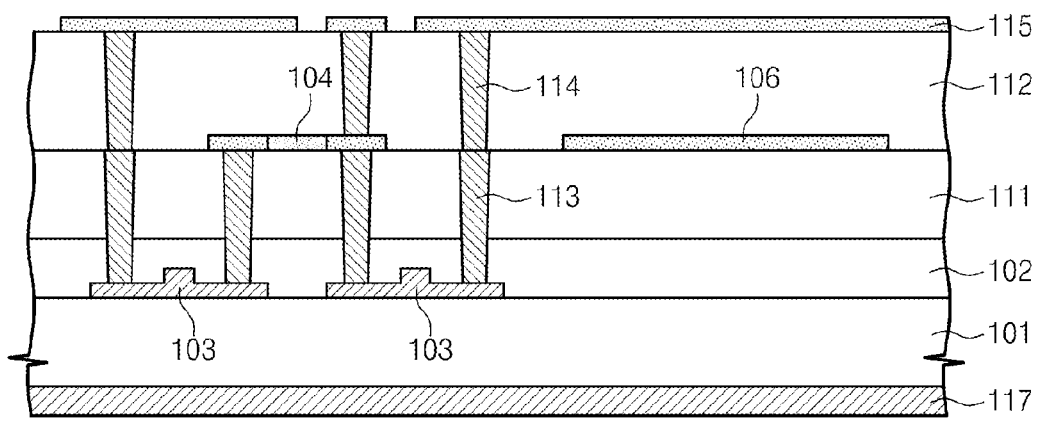
FIG. 3 is a sectional view schematically illustrating a semiconductor chip according to example embodiments of the inventive concept.

FIG. 3 is a sectional view schematically illustrating a semiconductor chip according to example embodiments of the inventive concept. FIG. 4 is a table showing dielectric constants and band gaps of some dielectric materials.

Referring to FIG. 3, a semiconductor chip according to example embodiments of the inventive concept may include active devices 103 integrated on a substrate 101 and passive devices 104 and 106 provided spaced apart from the substrate 101. For example, in a vertical sectional view, the active devices 103 may be located between the substrate 101 and the passive devices 104 and 106. The passive devices 104 and 106 may include the micro strip described with reference to FIG. 2, but example embodiments of the inventive concepts may not be limited thereto. For example, in certain embodiments, the passive devices 104 and 106 may further include at least one inductor, at least one resistor, and/or at least one capacitor.

At least one interlayered insulating layer may be interposed between the active devices 103 and the passive devices 104 and 106 to realize an electric isolation and a structural supporting. For example, although not limited to, a first interlayered insulating layer 102 may be provided on the substrate 101 to cover the active devices 103, and a second interlayered insulating layer 111 may be interposed between the first interlayered insulating layer 102 and the passive devices 104 and 106 to support structurally the passive devices 104 and 106, as shown in FIG. 2.

An interconnection structure 115 may be provided over the passive devices 104 and 106 to include, for example, a ground line. A third interlayered insulating layer 112 may be interposed between the interconnection structure 115 and the passive devices 104 and 106 to cover wholly a top surface of the resulting structure provided with the passive devices 104 and 106. According to example embodiments of the inventive concept, the third interlayered insulating layer 112 may be a high-k dielectric. For example, as shown in FIG. 4, the third interlayered insulating layer 112 may be one of silicon nitride (e.g., $Si_3N_4$), aluminum oxide (e.g., $Al_2O_3$), tantalum oxide (e.g., $Ta_2O_5$), titanium oxide (e.g., $TiO_2$), strontium titanate (e.g., $SrTiO_3$), zirconium oxide (e.g., $ZrO_2$), hafnium oxide (e.g., $HfO_2$), hafnium silicate (e.g., $HfSiO_4$), lanthanum oxide (e.g., $La_2O_3$), yttrium oxide (e.g., $Y_2O_3$), and/or amorphous lanthanum aluminate (e.g., $a$-$LaAlO_3$).

The interconnection structure 115 may include a portion electrically connected to at least one of the passive devices 104 and 106 (e.g., resistor) through vias 114, which may be formed to penetrate the third interlayered insulating layer 112. The interconnection structure 115 may include another portion provided on the passive device (e.g., the micro strip) constituting the high frequency circuit. Further, the interconnection structure 115 may include other portion electrically connected to the active devices 103 through contact plugs 113, which may be formed to penetrate the first and second interlayered insulating layers 102 and 111, and the vias 114.

According to the embodiments shown in FIG. 3, the passive devices 104 and 106 may be provided spaced apart from the substrate 101 and on the second interlayered insulating layer 111. As a result, it is possible to improve an area efficiency of the substrate 101. For example, it is possible to increase a ratio of an occupying area of the active devices 103 to a total area of the substrate 101. In other aspects of the inventive concept, it is possible to reduce a total size of the semiconductor chip, as the result of the increase in area ratio of the active devices 103. This is because, if the number of active devices constituting a semiconductor chip is fixed, the increase in area ratio of the active devices 103 makes it possible to reduce a substrate size of a unit chip.

Meanwhile, example embodiments of the inventive concepts may not be limited to an example, in which all passive devices of the semiconductor chip are formed spaced apart from the substrate 101. For example, in other embodiments, one or some of the passive devices 104 and 106 may be formed spaced apart from the substrate 101, and the others may be integrated on the top surface of the substrate 101. Even in this case, it is possible to obtain the afore-described technical advantage related to the increase in area ratio of the active devices 103.

According to other aspects of the inventive concept, in the case where the passive devices 104 and 106 are formed spaced apart from the substrate 101, the passive devices 104 and 106 may be designed and fabricated to have no dependency on the thickness and dielectric constant of the substrate 101. For example, in the case where a portion of the interconnection structure 115 serves as the ground line GND, the third interlayered insulating layer 112 may be used for the dielectric layer DL of the micro strip. Since a thickness and a material property of the third interlayered insulating layer 112 do not affect substantially performance of the active devices 103, the third interlayered insulating layer 112 may be formed to have a thickness and a material property optimized for the passive device (for example, the micro strip). For example, the third interlayered insulating layer 112 may be formed of a material having a dielectric constant higher than that of the substrate 101. In example embodiments, the increase in dielectric constant of the third interlayered insulating layer 112 makes it possible to reduce a size of the micro strip.

For example, in the case where the substrate 101 is formed of a GaAs layer having a dielectric constant of about 13 and a thickness of 100 μm, a 50-ohm λ/4 transmission line, in 10 GHz, is formed to have a width of 70 μm and a length of 2700 μm. By contrast, in the case where the third interlayered insulating layer 112 is formed of a dielectric material having a dielectric constant of 30 and a thickness of 50 μm, the transmission line can be formed to have a width of 10 μm and a length of 1800 μm. This is because, when the third interlayered insulating layer 112 is formed of a material having a high dielectric constant, an electric field from the transmission line is focused on the third interlayered insulating layer 112, although there is influence from the substrate 101 and the second interlayered insulating layer 111. Further, such a technical advantage on the micro strip can be achieved on other passive devices, such as the inductor, the resistor and/or the capacitor, in the same or similar manner.

FIGS. 5 through 9 are schematic sectional views illustrating a method of fabricating a semiconductor chip, according to example embodiments of the inventive concept.

Figure 5:
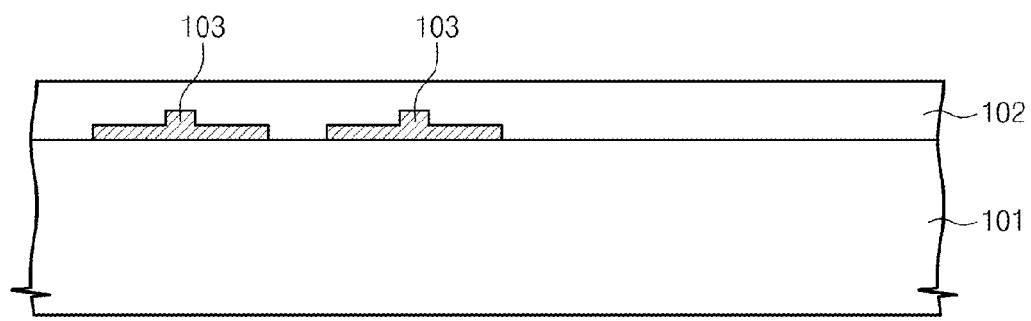
FIGS. 5 through 9 are schematic sectional views illustrating a method of fabricating a semiconductor chip, according to example embodiments of the inventive concept.

Referring to FIG. 5, active devices 103 may be formed on a substrate 101, and a first interlayered insulating layer 102 may be formed to cover the active devices 103. The substrate 101 may include at least one of Si, GaAs, InP, SiGe, SiC, or GaN.

In example embodiments, the active devices 103 may be provided in the form of a compound semiconductor transistor integrated on the substrate 101. For example, the formation of some of the active devices 103 may include forming a buffer layer and a channel layer on a silicon carbide substrate using an epitaxial technique, and forming a source electrode, a gate electrode, and a drain electrode. In other words, the active devices 103 may be high electron mobility transistors (HEMT), but example embodiments of the inventive concepts may not be limited thereto.

The first interlayered insulating layer 102 may be formed of at least one of silicon oxide, silicon nitride, or high-k dielectrics. In example embodiments, the first interlayered insulating layer 102 may be configured to prevent the active devices 103 from being damaged physically or chemically, thereby serving as a protection layer.

In other embodiments, before the formation of the first interlayered insulating layer 102, at least one passive device (not shown) may be formed on the substrate 101.

Figure 6:
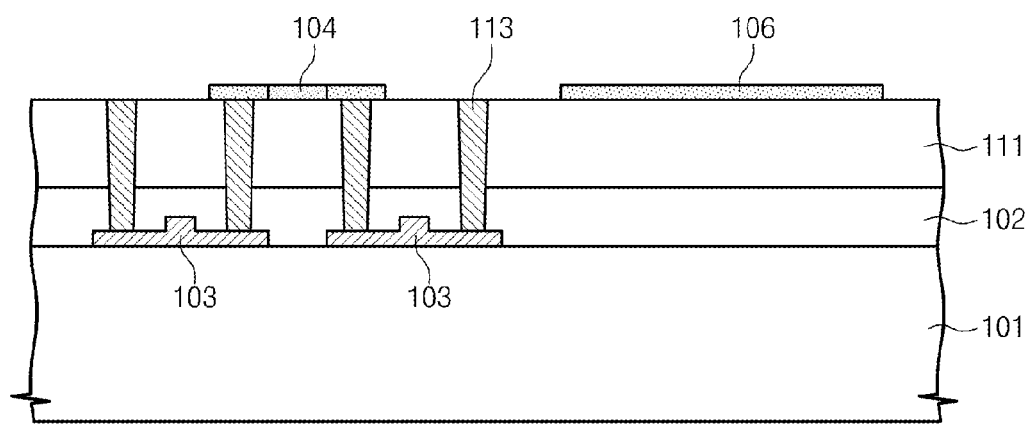

Referring to FIG. 6, a second interlayered insulating layer 111 may be formed on the first interlayered insulating layer 102, and contact plugs 113 may be connected to the active devices 103 through the first and second interlayered insulating layers 102 and 111. Thereafter, passive devices 104 and 106 may be formed on the second interlayered insulating layer 111.

The second interlayered insulating layer 111 may be formed of at least one of silicon oxide, silicon nitride, titanium oxide, zirconium oxide, or high-k dielectrics. The second interlayered insulating layer 111 may be formed using a sputtering process, a vapor deposition process, or a spin coating process. In certain embodiments, it is possible to omit the formation of the second interlayered insulating layer 111; that is, the passive devices 104 and 106 may be formed on the first interlayered insulating layer 102.

The formation of the contact plugs 113 may include forming contact holes to expose the electrodes of the active devices 103 and filling the contact holes with a conductive layer. The contact holes may be formed by, for example, a patterning process including a wet or dry etching step. The conductive layer may be formed using a plating or deposition process and include at least one of metallic elements, such as gold, nickel, or copper.

The passive devices 104 and 106 may be formed using a plating or deposition process and include at least one of metallic elements, such as gold, nickel, aluminum, or copper. Some of the passive devices 104 and 106 may be used to constitute a high frequency circuit. For example, some of the passive devices (e.g., 106) may be formed on the second interlayered insulating layer 111 to constitute a portion of the micro strip shown in FIG. 2. In example embodiments, others of the passive devices may constitute at least one inductor, at least one resistor, and/or at least one capacitor.

Like this, if some of the passive devices 104 and 106 constitute the high frequency circuit, the second interlayered insulating layer 111 may be formed of a material capable of reducing an electric interaction exerted from the substrate 101. For example, the second interlayered insulating layer 111 may be formed of a material (e.g., silicon oxide) whose dielectric constant is lower than that of the third interlayered insulating layer 112. Furthermore, the second interlayered insulating layer 111 may be formed to have a thickness that is sufficiently larger than a final thickness of the substrate 101. The large thickness of the second interlayered insulating layer 111 makes it possible to suppress the passive device constituting the high frequency circuit from being electrically affected by the substrate 101, and moreover, to relieve a technical difficulty in designing or fabricating the high frequency circuit.

Figure 7:
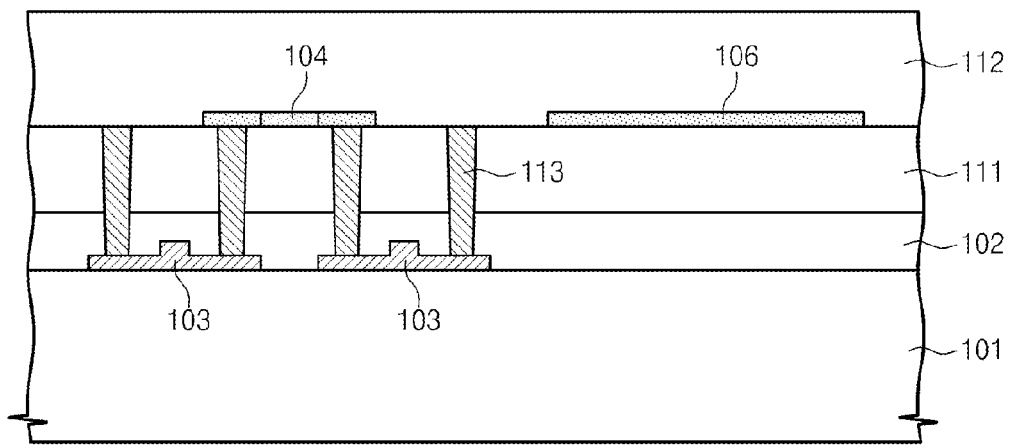
Figure 8:
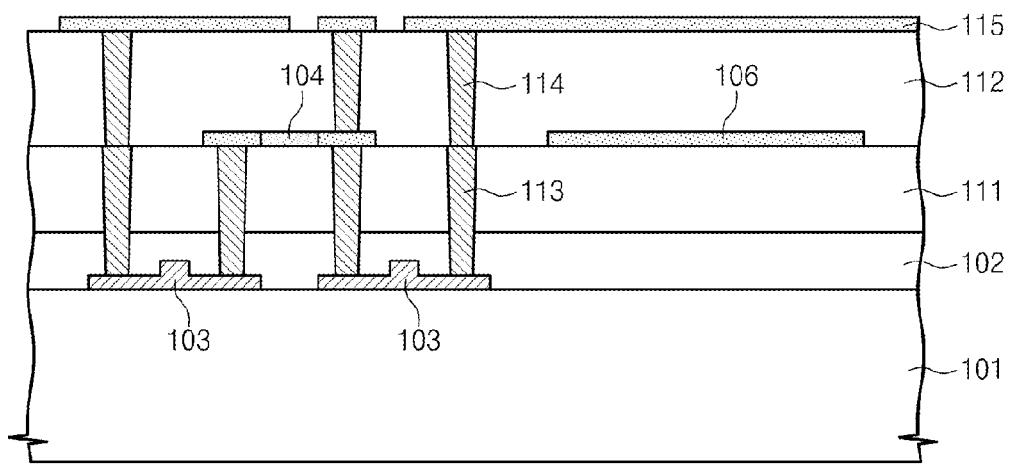

Next, as shown in FIG. 7, a third interlayered insulating layer 112 may be formed on the passive devices 104 and 106. Then, as shown in FIG. 8, vias 114 may be formed through the third interlayered insulating layer 112, and an interconnection structure 115 may be connected to the vias 114.

In example embodiments, the interconnection structure 115 may include a portion serving as the ground line GND of the micro strip of FIG. 2, and the third interlayered insulating layer 112 may serve as the dielectric layer DL of the micro strip. Since a thickness and a material property of the third interlayered insulating layer 112 do not affect substantially performance of the active devices 103, the third interlayered insulating layer 112 may be formed to have a thickness and a material property optimized for the passive device (for example, the micro strip).

For example, the third interlayered insulating layer 112 may be formed of a material, whose dielectric constant is greater than at least one or all of the substrate 101, the first interlayered insulating layer 102, or the second interlayered insulating layer 111. In example embodiments, the third interlayered insulating layer 112 may include at least one of silicon nitride (e.g., $Si_3N_4$), aluminum oxide (e.g., $Al_2O_3$), tantalum oxide (e.g., $Ta_2O_5$), titanium oxide (e.g., $TiO_2$), strontium titanate (e.g., $SrTiO_3$), zirconium oxide (e.g., $ZrO_2$), hafnium oxide (e.g., $HfO_2$), hafnium silicate (e.g., $HfSiO_4$), lanthanum oxide (e.g., $La_2O_3$), yttrium oxide (e.g., $Y_2O_3$), and/or amorphous lanthanum aluminate (e.g., a-$LaAlO_3$).

As previously described with reference to FIGS. 2 and 3, the increase in dielectric constant of the third interlayered insulating layer 112 makes it possible to reduce a size of the micro strip. In example embodiments, the third interlayered insulating layer 112 may be formed to have a thickness that is smaller than a thickness of each of the first and second interlayered insulating layers 102 and 111 or a total thickness thereof.

In example embodiments, the third interlayered insulating layer 112 may be formed to have a thickness ranging from 1 μm to 100 μm. Meanwhile, to improve a leakage current property, the third interlayered insulating layer 112 may be formed to have a large band gap. In other embodiments, the third interlayered insulating layer 112 may be formed to have a multi-layered structure including a large band gap material and a high dielectric constant material, which may be provided for improvement of a leakage current property and for optimization of the high frequency device, respectively.

The vias 114 may be formed by forming via holes to expose the electrodes of the passive devices 104 or the contact plugs 113 and then filling the via holes with a conductive layer. The via holes may be formed by, for example, a patterning process including a wet or dry etching step. The conductive layer, for the vias 114, may be formed using a plating or deposition process and include at least one of metallic elements, such as gold, nickel, or copper.

The interconnection structure 115 may be formed using a plating or deposition process and include at least one of metallic elements, such as gold, nickel, aluminum, or copper. The interconnection structure 115 may include a portion constituting the high frequency circuit. For example, a portion of the interconnection structure 115 may be used as the ground electrode GND of the micro strip shown in FIG. 2. In the case where the portion of the interconnection structure 115 is used as the high frequency circuit or the ground electrode GND of the micro strip, it may have a wide plate structure in order to improve characteristics of the high frequency circuit. For example, it may be formed to have a width greater than that of a passive device provided thereunder.

According to the above embodiments, the active and passive devices 103, 104, and 106 may be electrically connected to each other by interconnection lines that are provided on the top surface of the substrate 101, and thus, there is no need to form the back-side via hole shown in the comparative example of FIG. 1. Accordingly, it is possible to prevent various technical difficulties, which may occur in the process of forming the back-side via holes.

Figure 9:
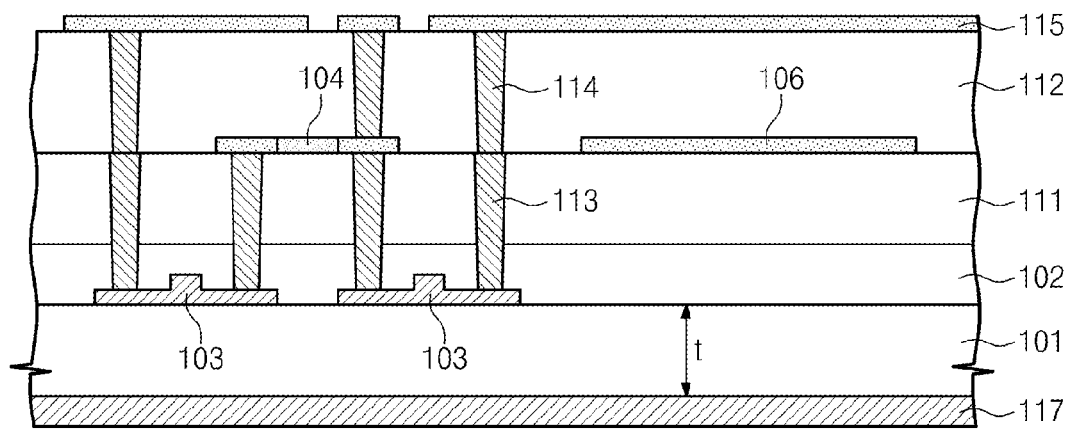

Referring to FIG. 9, a thinning process may be performed to a back surface of the substrate 101 to reduce the thickness of the substrate 101. The thinning process may include an etching or polishing step. As the result of the thinning process, semiconductor chips to be integrated on the substrate 101 can have an improved thermal emission property. Further, the increased thickness of the interlayered insulating layers 102, 111, and 112 makes it possible to perform the thinning process until the substrate 101 has a thickness of 100 μm or less. For example, the substrate 101 may be formed to have a final thickness that is smaller than a total thickness of the interlayered insulating layers 102, 111, and 112.

In example embodiments, as shown in FIG. 9, a metal layer 117 may be formed on the back surface of the substrate 101, to which the thinning process has been performed. Considering that most of heat generated in the active devices 103 may be exhausted through the substrate 101, the thickness reduction of the substrate and the presence of the back-side metal layer 117 make it possible to improve further thermal emission characteristics of the semiconductor chips.

Figure 10:
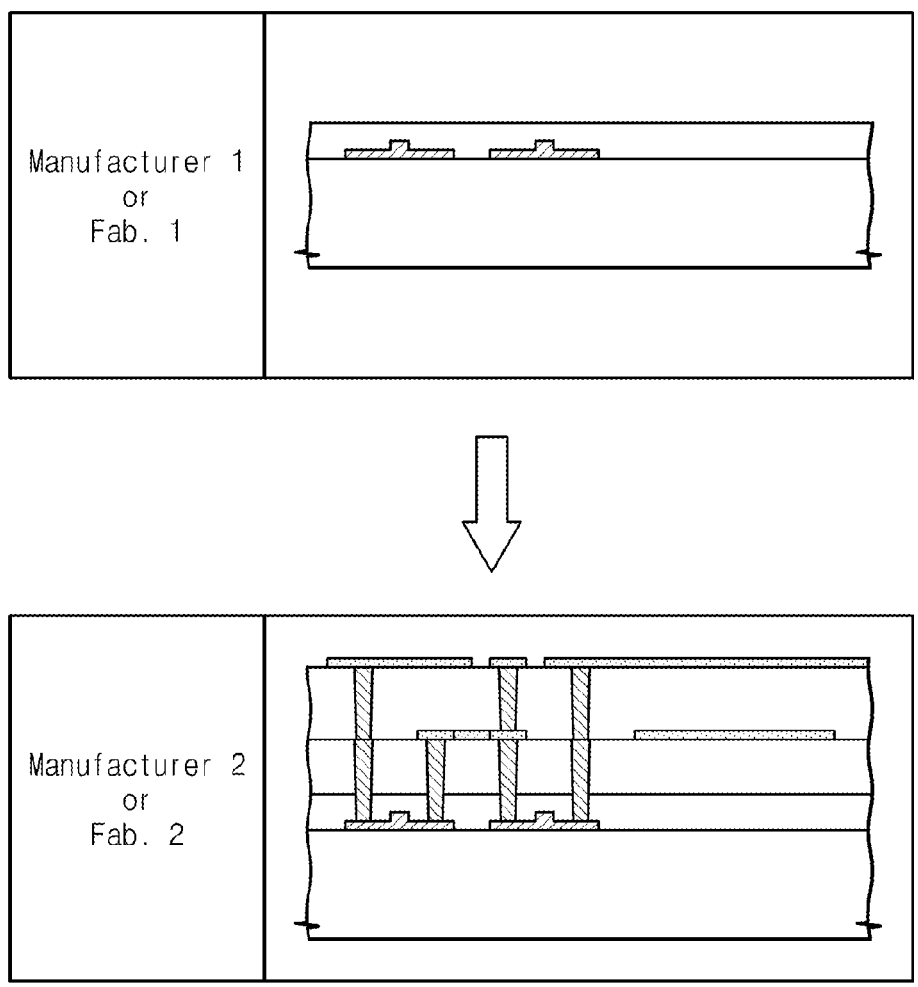
FIG. 10 is a schematic diagram illustrating a method of fabricating a semiconductor chip, according to example embodiments of the inventive concept.

FIG. 10 is a schematic diagram illustrating a method of fabricating a semiconductor chip, according to example embodiments of the inventive concept.

According to example embodiments of the inventive concept, as shown in FIG. 10, a process of fabricating semiconductor chips may be separately executed by different manufacturers or in different fabrication plants or buildings (hereinafter, referred as to a "FABs"). For example, the step of forming the active devices 103 on the substrate 101, described with reference to FIG. 5, may be executed by a manufacturer 1 or in a FAB 1, and other subsequent steps may be executed by a manufacturer 2 or in a FAB 2. In this case, the FAB 1 may be configured to include facilities optimized for the process of FIG. 5 or to perform a fabrication process optimized therefor, while the FAB 2 may be configured to include facilities optimized for the subsequent steps or to perform a fabrication process optimized therefor. As the result of this separated fabrication method, it is possible to reduce fabrication cost of the semiconductor chips.

According to example embodiments of the inventive concept, it is possible to adjust a dielectric constant and a thickness of a dielectric material, which are parameters affecting high frequency circuit characteristics. This makes it possible to improve flexibility in designing circuits and reduce a size of a passive device. Furthermore, since active and passive devices can be designed independently, it is possible to reduce a fabrication cost of chip and improve an area efficiency of chip.

In addition, it is possible to reduce a thickness of wafer, and thus, a semiconductor chip can have an improved thermal emission property. Furthermore, since an interconnection structure or a ground electrode is provided on the wafer, it is possible to omit a back-side via hole process that may cause various technical difficulties.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor chip, comprising:
   a substrate;
   an active device integrated on the substrate;
   a lower interlayered insulating layer covering the resulting structure provided with the active device;
   a passive device provided on the lower interlayered insulating layer, the passive device including a micro strip;
   an upper interlayered insulating layer covering the resulting structure provided with the passive device; and
   a ground electrode provided on the upper interlayered insulating layer,
   wherein the upper interlayered insulating layer is formed of a material, whose dielectric constant is higher than that of the lower interlayered insulating layer, and
   wherein the micro strip is separated from the ground electrode by the upper interlayered insulating layer without being electrically connected to the ground electrode, and forms a signal transmission line.

2. The semiconductor chip of claim 1, wherein the upper interlayered insulating layer is thinner than the lower interlayered insulating layer.

3. The semiconductor chip of claim 1, wherein the substrate comprises at least one of Si, GaAs, InP, SiGe, SiC, or GaN.

4. The semiconductor chip of claim 1, wherein the passive device is used as one of constituent parts of a high frequency circuit.

5. The semiconductor chip of claim 1, further comprising:
   an interconnection structure provided on the upper interlayered insulating layer; and
   plugs formed through the upper and lower interlayered insulating layers to connect the interconnection structure to the passive device and the active device.

6. The semiconductor chip of claim 1, further comprising plugs connected to the active device,
   wherein the plugs are provided on a top side of the substrate, and the substrate has a plate structure that is not penetrated by holes.

7. The semiconductor chip of claim 1, wherein the substrate is provided to have a thickness that is smaller than a total thickness of the lower and upper interlayered insulating layers.

8. The semiconductor chip of claim 1, wherein the upper interlayered insulating layer comprises at least one of silicon nitride, aluminum oxide, tantalum oxide, titanium oxide, strontium titanate, zirconium oxide, hafnium oxide, hafnium silicate, lanthanum oxide, yttrium oxide, or amorphous lanthanum aluminate.

9. The semiconductor chip of claim 1, wherein the passive device further includes an inductor or a resistor.

10. A method of fabricating a semiconductor chip, comprising:
    integrating an active device on a substrate;
    forming a lower interlayered insulating layer on the substrate integrated with the active device;
    forming a passive device on the lower interlayered insulating layer, the passive device including a high frequency circuit with a metal pattern formed to constitute a micro strip;
    forming an upper interlayered insulating layer to cover wholly the lower interlayered insulating layer provided with the passive device; and
    forming a metal layer on the upper interlayered insulating layer, and
    wherein the micro strip is separated from the metal layer by the upper interlayered insulating layer without being electrically connected to the metal layer, and forms a signal transmission line and wherein the upper interlayered insulating layer comprises forming a dielectric layer, whose dielectric constant is greater than that of the lower interlayered insulating layer.

11. The method of claim 10, wherein the substrate is formed of silicon carbide.

12. The method of claim 10, wherein the upper interlayered insulating layer comprises at least one of silicon nitride, aluminum oxide, tantalum oxide, titanium oxide, strontium titanate, zirconium oxide, hafnium oxide, hafnium silicate, lanthanum oxide, yttrium oxide, or amorphous lanthanum aluminate.

13. The method of claim 10, wherein the upper interlayered insulating layer is formed to have a thickness that is smaller than that of the lower interlayered insulating layer.

14. The method of claim 10, further comprising:
    forming contact plugs connected to the active device through the lower interlayered insulating layer, before the forming of the passive device; and
    forming vias connected to the passive device and the contact plugs through the upper interlayered insulating layer, before the forming of the metal layer.

15. The method of claim 10, further comprising a thinning process reducing a thickness of the substrate, wherein the thinning process is performed in such a way that a final thickness of the substrate is smaller than a total thickness of the lower and upper interlayered insulating layers.

16. The method of claim 15, after the thinning process, further comprising forming a lower metal layer to cover the thinned bottom surface of the substrate.

17. The method of claim 10, wherein the step of integrating the active device and its subsequent steps are independently executed using fabrication facilities that are different from each other and are provided in different buildings.

18. The method of claim 10, wherein the passive device further includes an inductor or a resistor.

* * * * *